(12) United States Patent
Wang

(10) Patent No.: US 8,779,861 B2
(45) Date of Patent: Jul. 15, 2014

(54) MULTI-PHASE VOLTAGE CONTROLLED OSCILLATOR USING CAPACITANCE DEGENERATED SINGLE ENDED TRANSCONDUCTANCE STAGE AND INDUCTANCE/CAPACITANCE LOAD

(75) Inventor: Dejun Wang, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 49 days.

(21) Appl. No.: 13/276,477

(22) Filed: Oct. 19, 2011

(65) Prior Publication Data
US 2013/0099871 A1    Apr. 25, 2013

(51) Int. Cl.
*H03K 3/03*    (2006.01)

(52) U.S. Cl.
CPC ..................... *H03K 3/0315* (2013.01)
USPC ...................... 331/57; 331/117 FE

(58) Field of Classification Search
USPC ......... 331/45, 57, 108 B, 117 FE, 117 R, 167
See application file for complete search history.

(56) References Cited

U.S. PATENT DOCUMENTS

| | | | | |
|---|---|---|---|---|
| 5,561,398 A | * | 10/1996 | Rasmussen | 331/36 C |
| 6,100,770 A | * | 8/2000 | Litwin et al. | 331/117 FE |
| 6,992,520 B1 | * | 1/2006 | Herbert | 327/377 |
| 7,474,164 B2 | * | 1/2009 | Saito et al. | 331/167 |
| 7,649,424 B2 | * | 1/2010 | Cusmai et al. | 331/117 R |
| 7,868,705 B2 | * | 1/2011 | Aramata | 331/49 |
| 8,022,778 B2 | * | 9/2011 | Nagaraj et al. | 331/117 FE |
| 8,058,938 B2 | * | 11/2011 | Aga et al. | 331/117 FE |
| 8,159,308 B1 | * | 4/2012 | Sutardja | 331/117 FE |
| 8,237,509 B2 | * | 8/2012 | Kim et al. | 330/306 |
| 2007/0085617 A1 | * | 4/2007 | Salerno | 331/167 |

* cited by examiner

*Primary Examiner* — Levi Gannon
(74) *Attorney, Agent, or Firm* — Rahman LLC

(57) ABSTRACT

An electrical circuit includes a first transistor having a first source, a first drain, and a first gate, whereby the first transistor receives an input voltage through the first gate. An output voltage terminal outputs voltage from the first transistor and is connected to the first drain. A second transistor includes a second source, a second drain, and a second gate, whereby the second transistor receives a bias voltage through the second gate, and wherein the first source is connected to the second drain. A first capacitor is connected to the first source, the second source, and the second drain. An inductor is connected to the first drain. A second capacitor is connected in parallel with the inductor and further connected to the first drain.

19 Claims, 18 Drawing Sheets

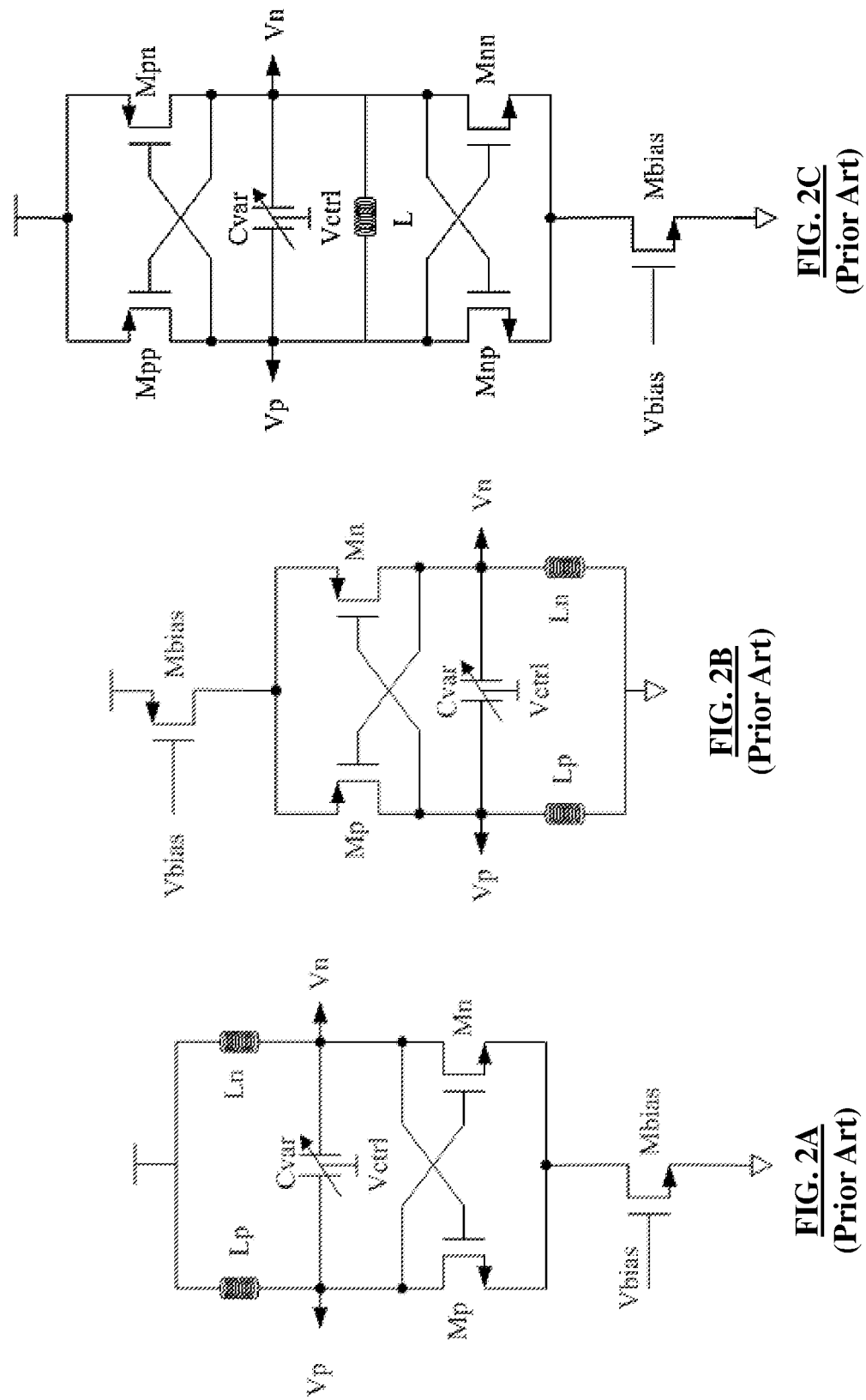

MULTI-PHASE VOLTAGE CONTROLLED OSCILLATOR USING CAPACITANCE DEGENERATED SINGLE ENDED TRANSCONDUCTANCE STAGE AND INDUCTANCE/CAPACITANCE LOAD

TECHNICAL FIELD

The embodiments herein generally relate to circuit design, and, more particularly, to radio frequency multi phase voltage controller oscillators.

BACKGROUND AND SUMMARY

Voltage controlled oscillators (VCO) are a key component of every integrated circuit, as most of today's electronics are synchronous systems, which require a system clock. A Local Oscillator (LO) in a radio frequency (RF) wireless system is also a type of VCO. Generally, the LO is the most critical block in the entire RF system as its performance determines many RF system parameters such as signal-to-noise ratio, image rejection, harmonic rejection, immunity to strong out of band blocking interferers, etc. Different types of VCOs that are typically used in industry include Ring Oscillators, LC Oscillators, Crystal Oscillators, Relaxation Oscillators, among others. Ring Oscillators employ several delay stages in a ring type fashion. Delay stages can be single ended or differential as shown in FIGS. 1A and 1B. When the number of stages exceeds two, the gain around the loop becomes bigger than 1 at 180 degrees phase shift and oscillation will start. If single ended delay stages are used, then odd-number of delay stages are needed. FIG. 1C shows a 3-stage single-ended ring oscillator and FIG. 1D shows a 5-stage single-ended ring oscillator. If differential delay stages are used, then even number of delay stages can be used to form the ring as shown in FIG. 1E. The delay of each stage is determined by the current in each delay stage and the output capacitance. Since one phase rotation travels through N identical delay stages (N representing a non-zero number), the phase difference between adjacent delay stages is 360/N and phase rotation is determined without ambiguity. This means that the phase at different delay stage outputs has a deterministic order, for example in FIG. 1B, the phase at Phi_0 is always leading Phi_1 by 60 degrees, the phase at Phi_1 is always leading Phi_2 by 60 degrees, etc. It would not be possible to have Phi_0 lagging Phi_1 by 60 degrees because that is a non-causal system and contradicts with the physics of the system.

For wireless applications, the LO normally uses a LC tank oscillator structure instead of ring oscillator due to its superior phase noise performance. FIGS. 2A through 2C illustrate possible implementations of the LC tank oscillator using a n-type metal-oxide-semiconductor (NMOS) transistor, a p-type metal-oxide-semiconductor (PMOS) transistor, as well as both NMOS and PMOS transistors as input and inductor Lp, Ln, and tunable capacitor Cvar as the load. An example of the LC tank impedance profile is shown in FIG. 2D. The oscillation occurs at the LC tank resonant frequency, which is:

$$w = \frac{1}{2\pi\sqrt{L \cdot C}}.$$

The quality factor of the tank ranges from 5 to 20 in today's silicon manufacturing process and this selective impedance profiling around the resonant frequency directly translates into a factor a 14 to 26 dB improvement in phase noise when one operates close to resonant frequency. This is the main reason that the LC tank oscillator dominates today's RF wireless applications.

In today's wireless applications, many RF system architectures employ low intermediate frequency architecture (Low IF). In Low IF RF systems, quadrature clock signals are required to perform image rejection. As shown in FIG. 3, a RF signal centered at frequency $f_{RF}$ undergoes frequency translation by mixing with both in phase (LO_I) and quadrature (LO_Q) clock signals from local oscillator which centered at $f_{LO}$, after down conversion, the wanted RF signal is frequency translated to an intermediate frequency (IF) at $f_{RF}$-$f_{LO}$, but at the same time, the unwanted signal centered at $2f_{LO}$-$f_{RF}$ is also down converted to the same IF frequency. This unwanted signal at $2f_{LO}$-$f_{RF}$ is called the image component as it sits at the same frequency distance from the LO as the wanted RF signal. The image component can be much larger than the desired RF signal and will corrupt the mixer output to degrade system performance if not properly addressed. Thus, another block is needed after the mixer which is the poly phase filter. A poly phase filter is a network of resistors and capacitors. FIG. 4A shows a 1-stage poly phase filter, and FIG. 4B is a 2-stage poly phase filter. A poly phase filter provides a 90 degree phase shift between its outputs I and Q. After the poly phase filter, the signal component at $f_{RF}$ from both the I and Q mixer path adds up while the image component at $2f_{LO}$-$f_{RF}$ from the I and Q mixer paths cancel each other. Hence, the quadrature mixing and poly phase filter together provide a very important functionality, namely image rejection for low IF system.

Passive components such as resistors and capacitors match really well on chip (60 dB matching is easily obtained in today's fine line lithography), and the image rejection performance is mainly limited by the phase accuracy of the LO clock signals driving the mixer. Quick simulation shows that the phase imbalance between I/Q should be less than 0.2 degrees to have a better than 50 dB image rejection.

Traditionally, industry has used one voltage controlled oscillator to oscillate at twice the LO frequency and then divide down to obtain I and Q phase clock signals. This is shown in FIG. 5. However, as the LO clock frequency increases due to more and more bandwidth requirement from today's applications, the difficulty of designing the VCO, especially VCO oscillating at multi-gigahertz, becomes more and more challenging and poses a performance bottleneck for the overall system. A VCO oscillating at twice the desired LO frequency normally consumes much more power than twice the power of a VCO that oscillates at just the LO frequency and exhibits worse phase noise than 6 dB degradation compared to the VCO at just the LO frequency. Thus, it is of high interest to generate I/Q phase clock signals at the LO frequency instead of twice the LO. The conventional solution uses two identical LC VCO oscillating at LO and couples them together using active devices or passive components. FIG. 6A shows a VCO that generates I/Q signals through active device coupling. FIG. 6B shows a VCO that uses capacitive coupling for I/Q generation. For the second approach, the I/Q phase relationship is undetermined, which means I and Q will be 90 degrees different from each other, but Q can be either 90 degrees ahead of I or 90 degrees lagging I. An undetermined phase relationship causes down-conversion errors; e.g., unwanted image components will be down converted instead of the desired RF signal. Thus, active devices are still needed in the capacitive coupling approach to ensure no ambiguity in the I/Q phase relationship. However, using an active device to couple two VCOs degrades the I/Q quadrature phase accuracy. Due to random process variations, the final device that is manufactured on silicon varies in width, length, as well as device physical parameters such as mobility, threshold voltage, etc. Therefore, the coupling strength is different from device to device and obeys Gaussian distribution. This leads to the random variation of the I/Q phase relationship. Although bigger devices sizes improve matching and hence lower the random phase error, in multi gigahertz applications, a bigger device size introduces more parasitic capacitance, and hence an upper bound is mandated on device size. This translates to a lower bound of the variance of random phase errors. Also, to ensure no ambiguity of the I/Q phase relationship, the size of the active device needs to be bigger than a certain minimum threshold. This causes the I/Q clock signal to have a static phase error.

Accordingly, in today's wireless applications, LC oscillators are the preferred architecture of VCOs due to their phase noise advantage. In a low IF system, to generate quadrature clock phases for image rejection, either the VCO has to oscillate at twice the LO or the VCO has to oscillate at the LO to generate multiple phases. The conventional method of designing the VCO oscillating at the LO with active coupling has its limitations; to ensure a deterministic phase relationship between VCO's quadrature outputs, active coupling is needed. However, due to random variations of the device being manufactured, instead of an ideal 90 degrees phase angle difference, the I and Q clock signals suffer from a static dc phase offset as well as random phase errors. Both the static phase offset and variance of the phase errors have a lower bound and degrade system performance. Phase dc offset in the range of 1 to 2 degrees and standard deviation of random phase errors in the range of 0.5 degree is very common. Although the phase error between the I/Q clock signal is small compared to one cycle of oscillation, which is 360 degrees, 1 degree of phase error directly translates to about 30 dB of image rejection. To the overall RF system, this means that an external component is needed such as an expensive RF ceramic SAW filter to filter out strong image blockers. Therefore, there remains a need to develop a new architecture employing the benefits of ring oscillators and LC tank oscillators while also providing enhanced phase noise improvement.

BRIEF DESCRIPTION OF THE DRAWINGS

The embodiments herein will be better understood from the following detailed description with reference to the drawings, in which:

FIG. 2A is a circuit diagram of a LC tank oscillator with NMOS transconductance as gain;

FIG. 2B is a circuit diagram of a LC tank oscillator with PMOS transconductance as gain;

FIG. 2C is a circuit diagram of a LC tank oscillator with both NMOS and PMOS transconductance as gain;

DETAILED DESCRIPTION

Figure 1A:
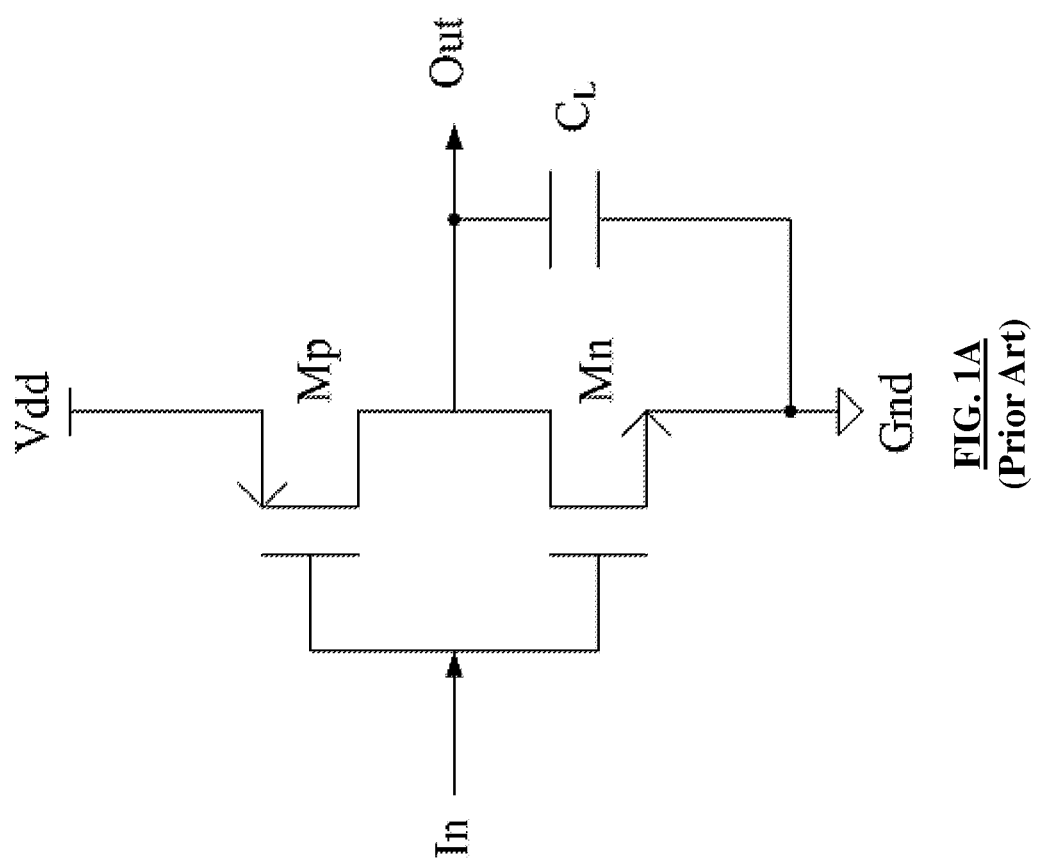
FIG. 1A is a circuit diagram of a single-ended delay cell for a ring oscillator.
Figure 1B:
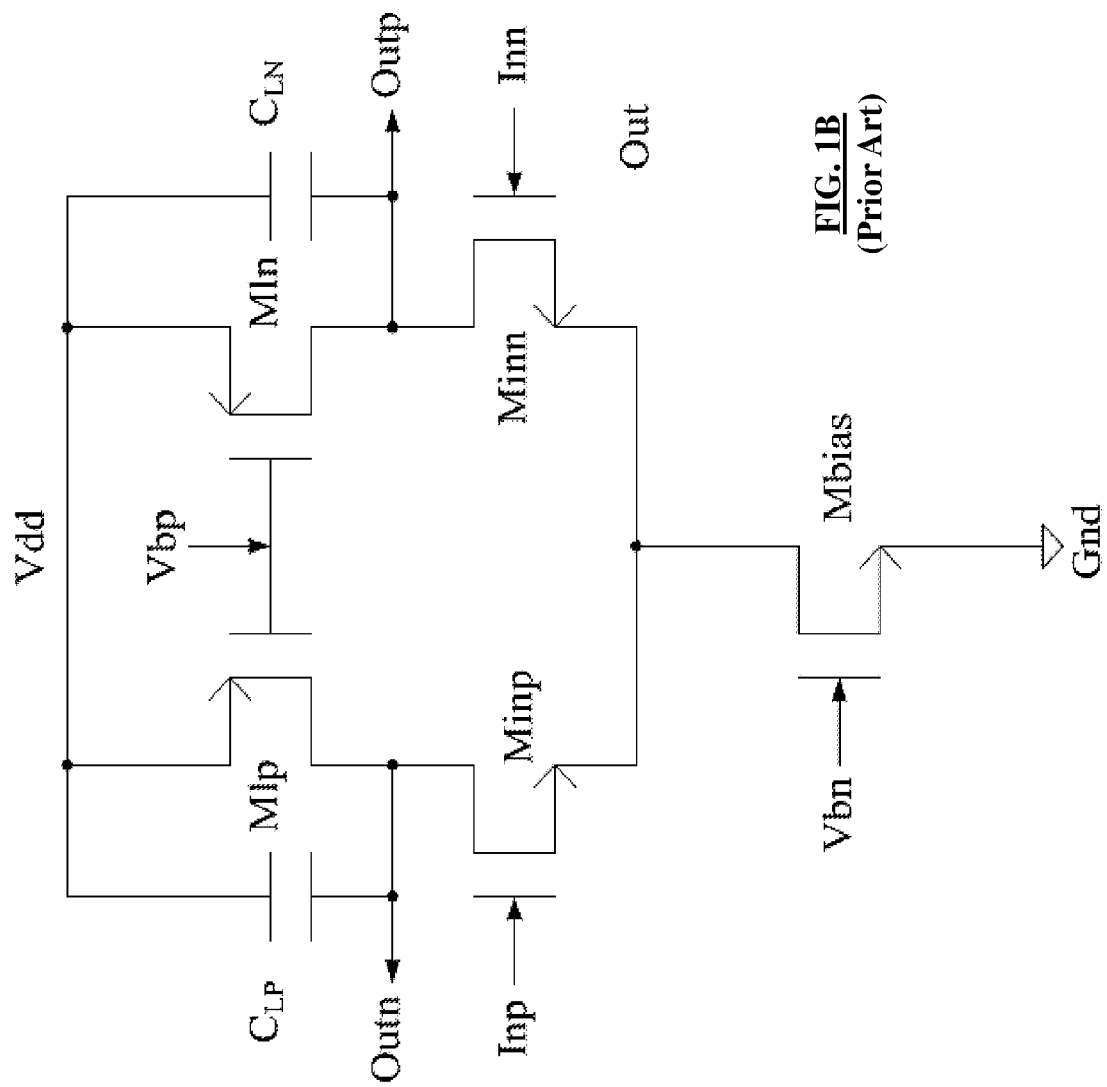
FIG. 1B is a circuit diagram of a differential delay cell for a ring oscillator.
Figure 1C:
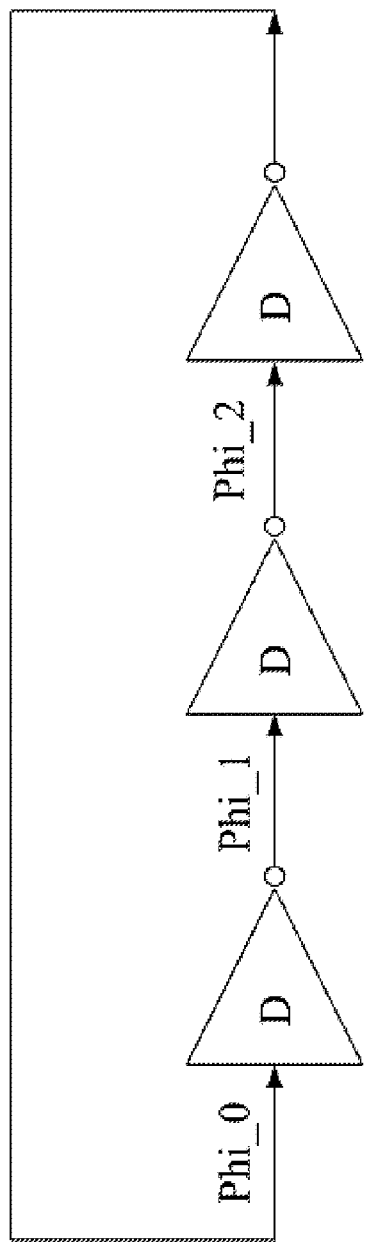
FIG. 1C is a circuit diagram of a 3-stage single-ended ring oscillator.
Figure 1D:
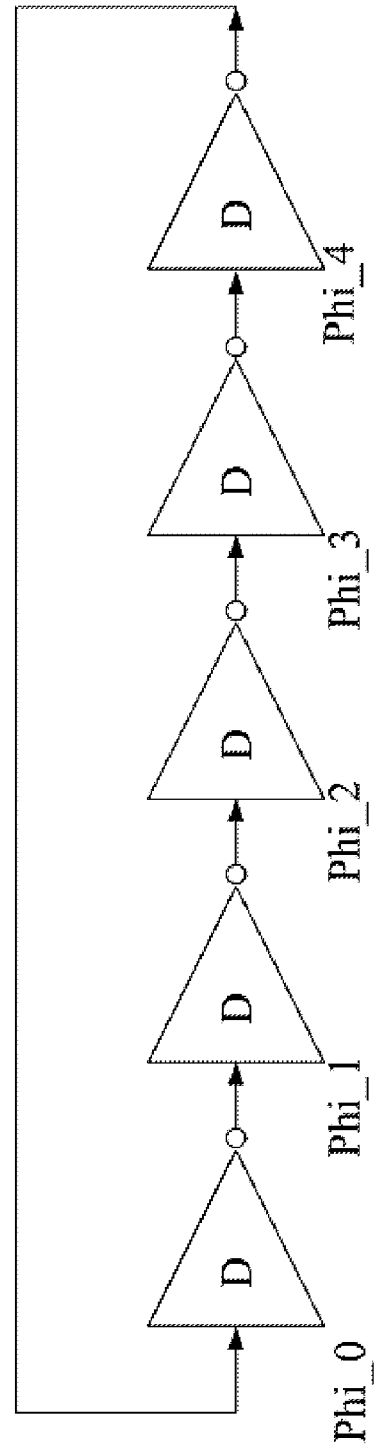
FIG. 1D is a circuit diagram of a 5-stage single-ended ring oscillator.
Figure 1E:
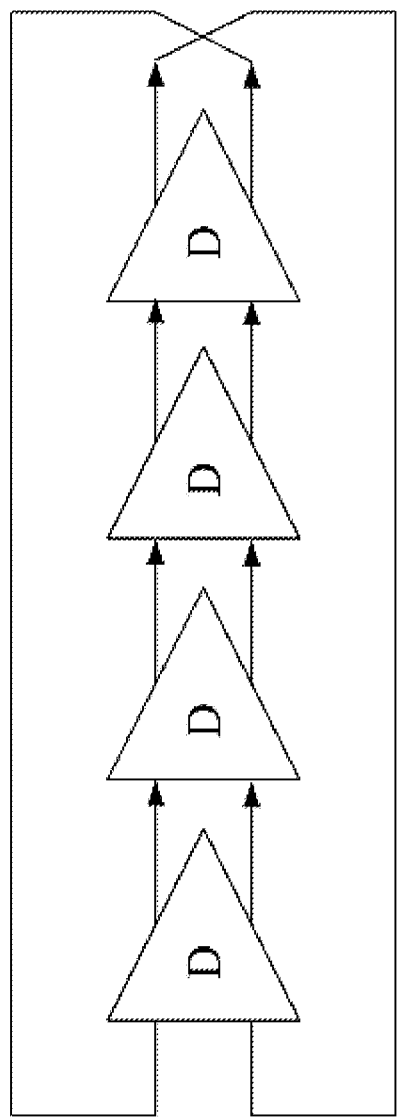
FIG. 1E is a circuit diagram of a 4-stage single-ended ring oscillator.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a multi-phase VCO using capacitance degenerated single ended transconductance (Gm) stage and an inductance/capacitance load. Referring now to the drawings, where similar reference characters denote corresponding features consistently throughout the figures, there are shown additional embodiments.

The embodiments herein provide a circuit topology that can generate accurate quadrature clock signals with no ambiguity of phase rotation direction and similar phase noise performance as LC tank VCO through the employment of a Gm/C delay element and a LC tank load as the unit delay stage in a ring oscillator structure. Moreover, the embodiments herein provide a novel VCO architecture by using a Gm/C delay element and LC tank load as the unit delay stage in a ring oscillator. With this architecture, extremely accurate multi-phase output can be obtained while comparable phase noise performance as LC tank VCO can be achieved. This structure combines the advantages of both types of VCOs.

Figure 7A:
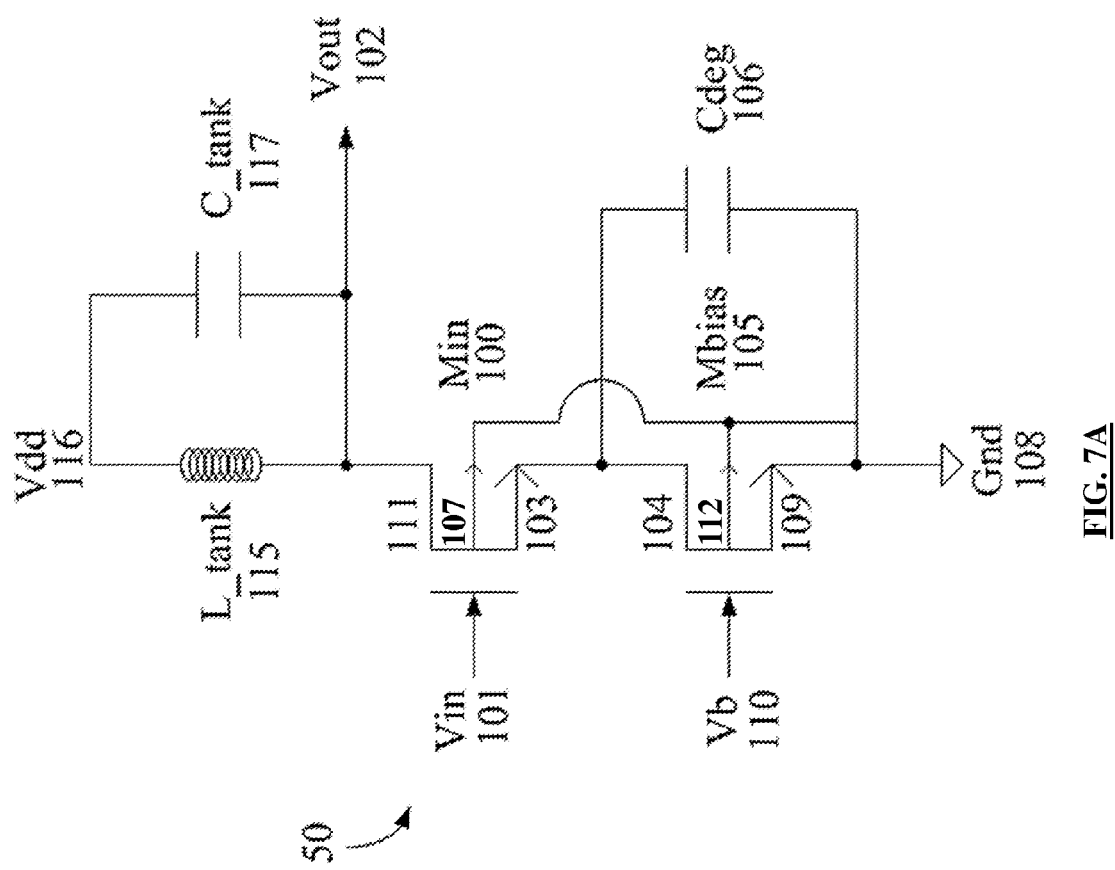
FIGS. 7A and 7B are circuit diagrams illustrating a unit delay stage that employs a Gm/C delay element and LC tank as the load with a NMOS used as the transconductance (Gm)
Figure 7B:
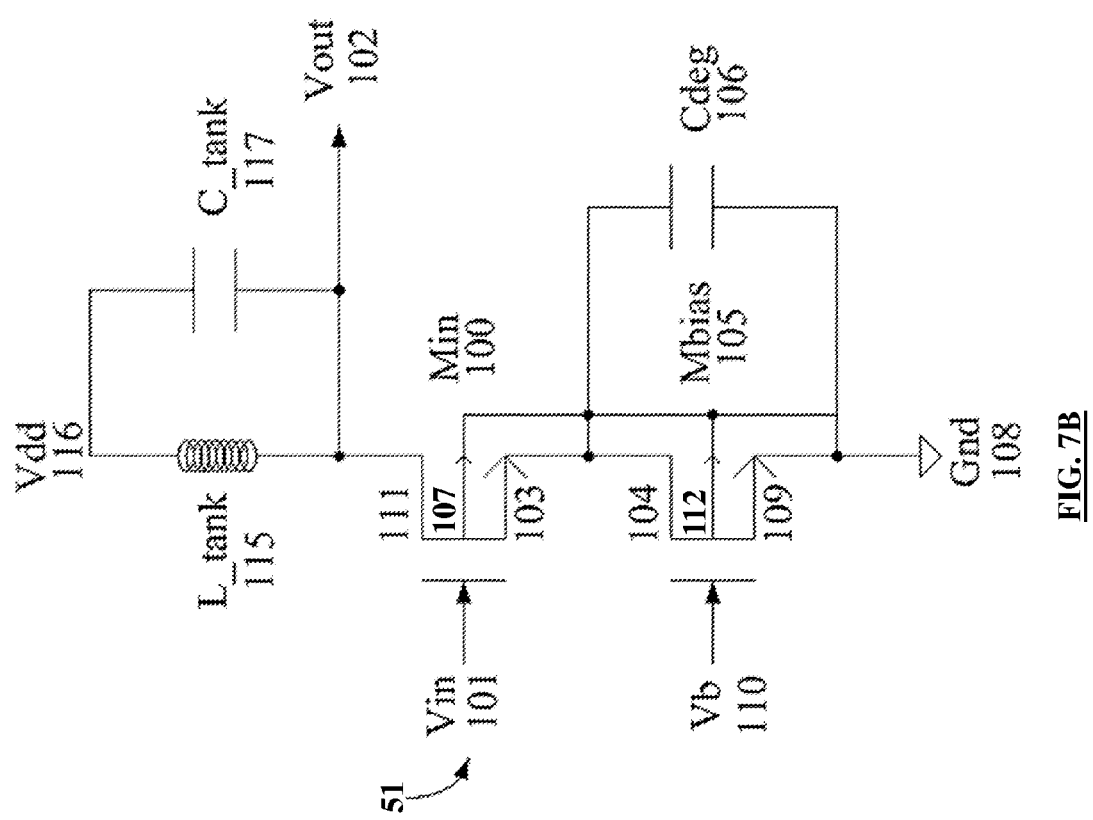
Figure 7C:
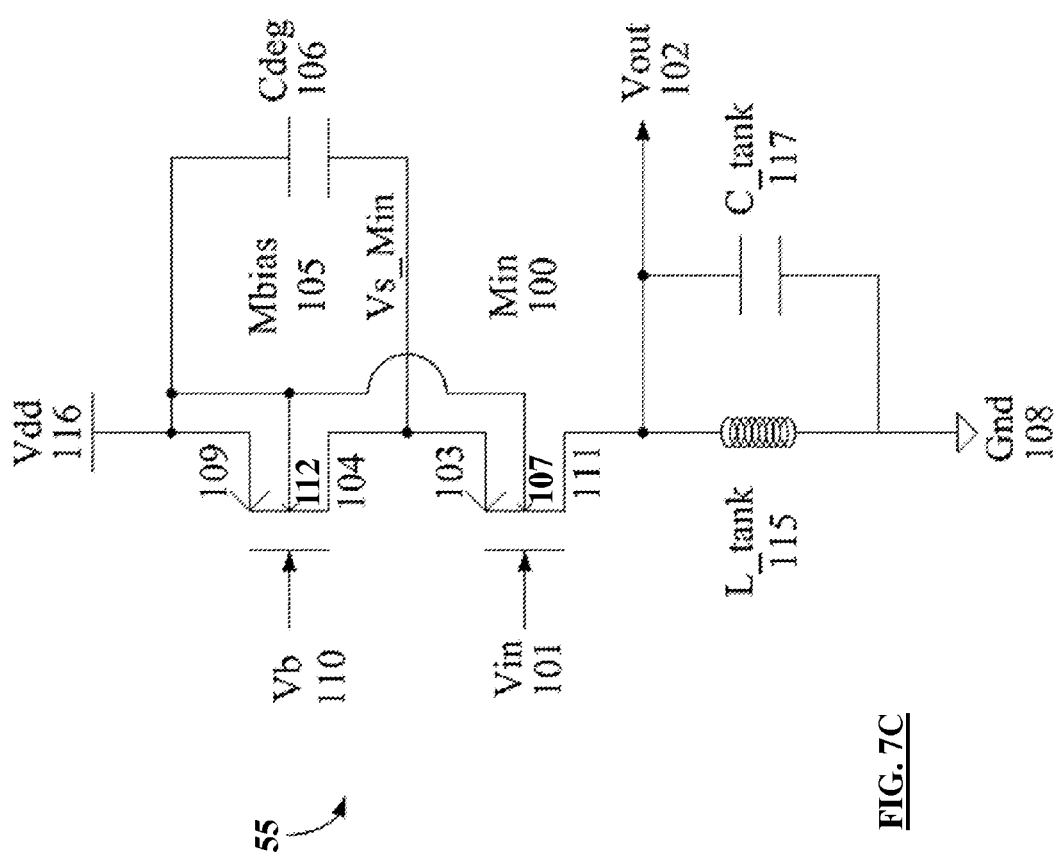
FIGS. 7C and 7D are circuit diagrams illustrating a unit delay stage that employs a Gm/C delay element and LC tank as the load with a PMOS used as the transconductance (Gm)
Figure 7D:
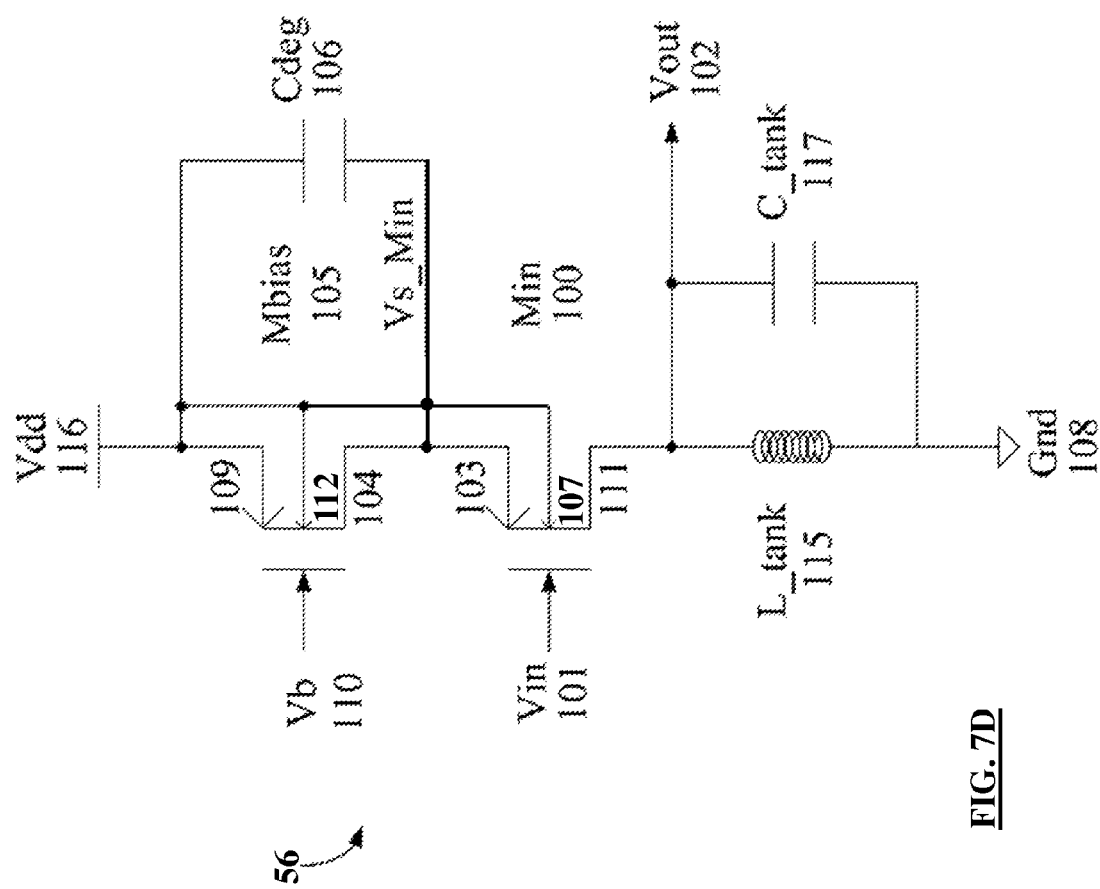

FIGS. 7A and 7B illustrate circuits 50, 51, respectively, depicting two possible implementations using a NMOS as the transconductance of the unit delay stage. FIGS. 7C and 7D illustrate circuits 55, 56, respectively, showing illustrations of two possible implementations using a PMOS as the transconductance of the unit delay stage. Each unit delay stage includes the following elements:

A three/four-terminal device Min 100 receives its input at its gate terminal Vin 101 and transfers the signal to its drain terminal Vout 102. The source terminal 103 is connected to the drain terminal 104 of device Mbias 105 and top plate terminal of Cdeg 106. In the case of a four-terminal device, the bulk terminal 107 can be connected to ground 108 (as shown in FIGS. 7A and 7C) or can be connected to the source terminal 103 (as shown in FIGS. 7B and 7D) depending on the bulk connection. A three/four-terminal device Mbias 105 receives a bias voltage Vb 110 at its gate terminal and connects to the source terminal 103 of the device Min 100 through its drain terminal 104. Its drain terminal 104 also connects to a capacitance top plate Cdeg 106. The source terminal 109 and bulk terminal 112 of device 105 connects to ground 108. The degenerative capacitance Cdeg 106 has its top plate terminal connect to the source terminal 103 of the device Min 100 and the drain terminal 104 of the device Mbias 105. The bottom plate terminal connects to ground 108 or AC ground (i.e., DC voltage that is non-zero). An inductance L_tank 115 has one terminal connected to the power supply Vdd 116 and another terminal connected to the drain terminal 111 of Min 100. A capacitance C_tank 117 has one terminal connected to Vdd 116 and another terminal connected to the drain terminal 111 of Min 100.

Figure 7E:
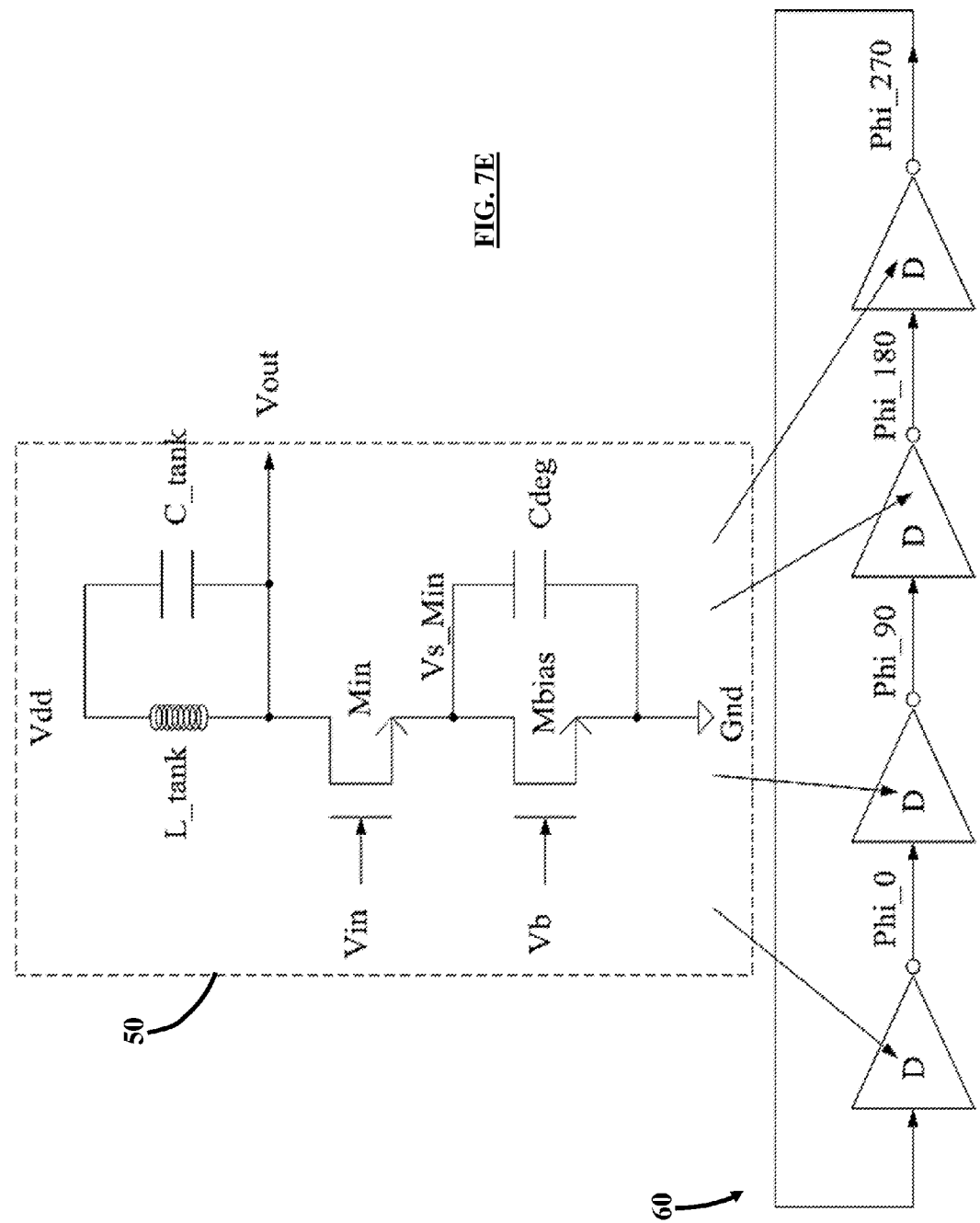
FIG. 7E is a circuit diagram illustrating a 4-unit delay stage to construct a 4-stage ring oscillator that generates 0, 90, 180, 270 clock phases.
Figure 7F:
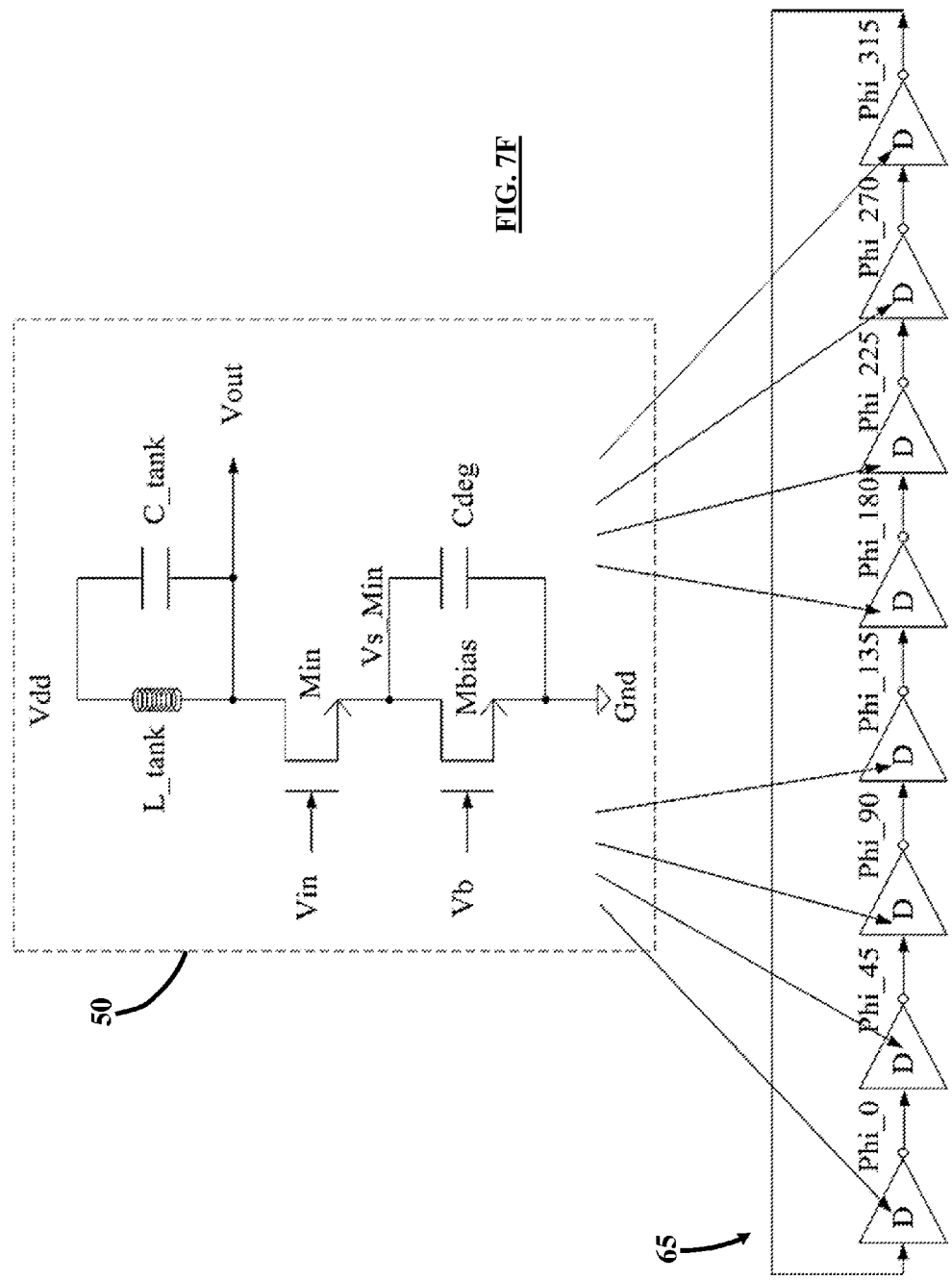
FIG. 7F is a circuit diagram illustrating an 8-unit delay stage to construct an 8-stage ring oscillator that generates 0, 45, 90, 135, 180, 225, 270, 315 clock phases.

There are many configurations possible using the unit delay stage to construct a VCO. FIG. 7E shows one VCO using a 4-unit delay stage 60 to generate 0, 90, 180, 270 degree phases. FIG. 7F shows one VCO using an 8-unit delay stage 65 to generate 0, 45, 90, 135, 180, 225, 270, 315 degree phases.

With respect to FIGS. 7A through 7F, the embodiments herein provide an electrical circuit 50, 51, 55, 56 comprising an input transistor Min 100 comprising a first source terminal 103, a first drain terminal 111, and a first gate terminal (e.g., Vin 101), the input transistor Min 100 adapted to receive an input voltage through the first gate terminal (e.g., Vin 101). An output voltage terminal Vout 102 is adapted to output voltage from the input transistor Min 100, the output voltage terminal Vout 102 being connected to the first drain terminal 111. A bias transistor Mbias 105 comprises a second source terminal 109, a second drain terminal 104, and a second gate terminal (e.g., Vb 110), wherein the bias transistor Mbias 105 is adapted to receive a bias voltage through the second gate terminal (e.g., Vb 110), and wherein the first source terminal 103 is connected to the second drain terminal 104. A degenerative capacitor Cdeg 106 is connected to the first source terminal 103, the second source terminal 109, and the second drain terminal 104, wherein the degenerative capacitor Cdeg 106 degenerates an input transconductance (Gm) of the input transistor Min 100. A tank load 115, 117 is connected to the first drain terminal 111, wherein the tank load 115, 117 comprises a tank inductor L_tank 115 connected to the first drain terminal 111. The tank load 115, 117 further comprises a tank capacitor C_tank 117 connected in parallel with the tank inductor L_tank 115 and is further connected to the first drain terminal 111, wherein the degenerative capacitor Cdeg 106 and the tank load 115, 117 create a unit delay stage of the input transistor Min 100.

The input and bias transistors Min 100, Mbias 105, respectively, comprise any of a NMOS transistor (see FIGS. 7A and 7B) and a PMOS transistor (see FIGS. 7C and 7D). The circuit 50, 51, 55, 56 may further comprise a power supply voltage terminal Vdd 116 that receives a power supply voltage and is connected to any of the tank inductor L_tank 115 and the second source terminal 109. A top plate of the degenerative capacitor Cdeg 106 is connected to the first source terminal 103 and the second drain terminal, 104 and a bottom plate of the degenerative capacitor Cdeg 106 is connected to ground 108. The bias transistor Mbias 105 transfers the input voltage into current and creates a phase shift delay in the output voltage Vout 102. The unit delay stage 60 generates 0, 90, 180, and 270 degree phases. Alternatively, the unit delay stage 65 generates 0, 45, 90, 135, 180, 225, 270, and 315 degree phases. The input/output transfer function of each the unit delay stage 60, 65 comprises:

$$\frac{V_{OUT}}{V_{IN}} = \frac{-G_{ds\_tail}}{G_T} \frac{1 + \frac{s}{z_1}}{1 + \frac{s}{p_1}},$$

$$z_1 \approx \frac{G_{ds\_tail}}{C_{deg}},$$

$$p_1 \approx k \frac{G_{m\_in}}{(C_{gs\_in} + C_{deg})},$$

$$k = \frac{G_T}{G_T + G_{ds\_in}},$$

wherein $G_{ds\_tail}$ comprises a channel admittance of the bias transistor Mbias 105, wherein $G_T$ comprises an admittance of the tank inductor L-tank 115 in parallel with the tank capacitor C_tank 117, wherein $C_{deg}$ comprises a degenerative capacitance, wherein $G_{m\_in}$ comprises a transconductance of the input transistor Min 100, and wherein $G_{ds\_in}$ comprises a channel admittance of the input transistor Min 100. The degenerative capacitor Cdeg 106 degenerates the transconductance of the input transistor Min 100 and introduces a zero into the input/output transfer function, wherein the zero comprises $$\frac{G_{ds\_tail}}{C_{deg}}$$

and provides a 90 degrees phase lead when the frequency is below $$k \frac{G_{m\_in}}{(C_{gs\_in} + C_{deg})}.$$

Figure 2D:
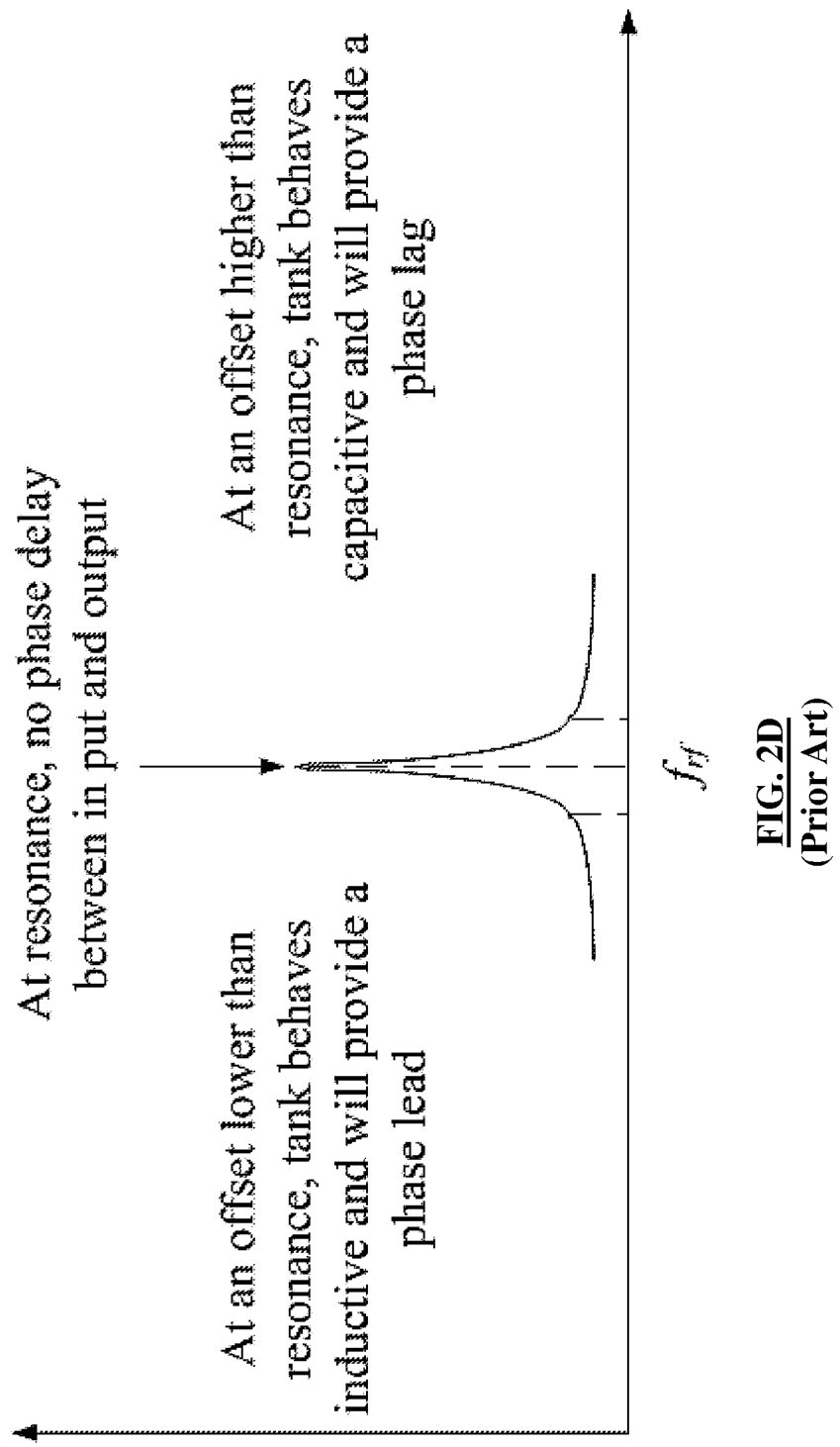
FIG. 2D is a diagram illustrating a LC tank impedance profile.
Figure 3:
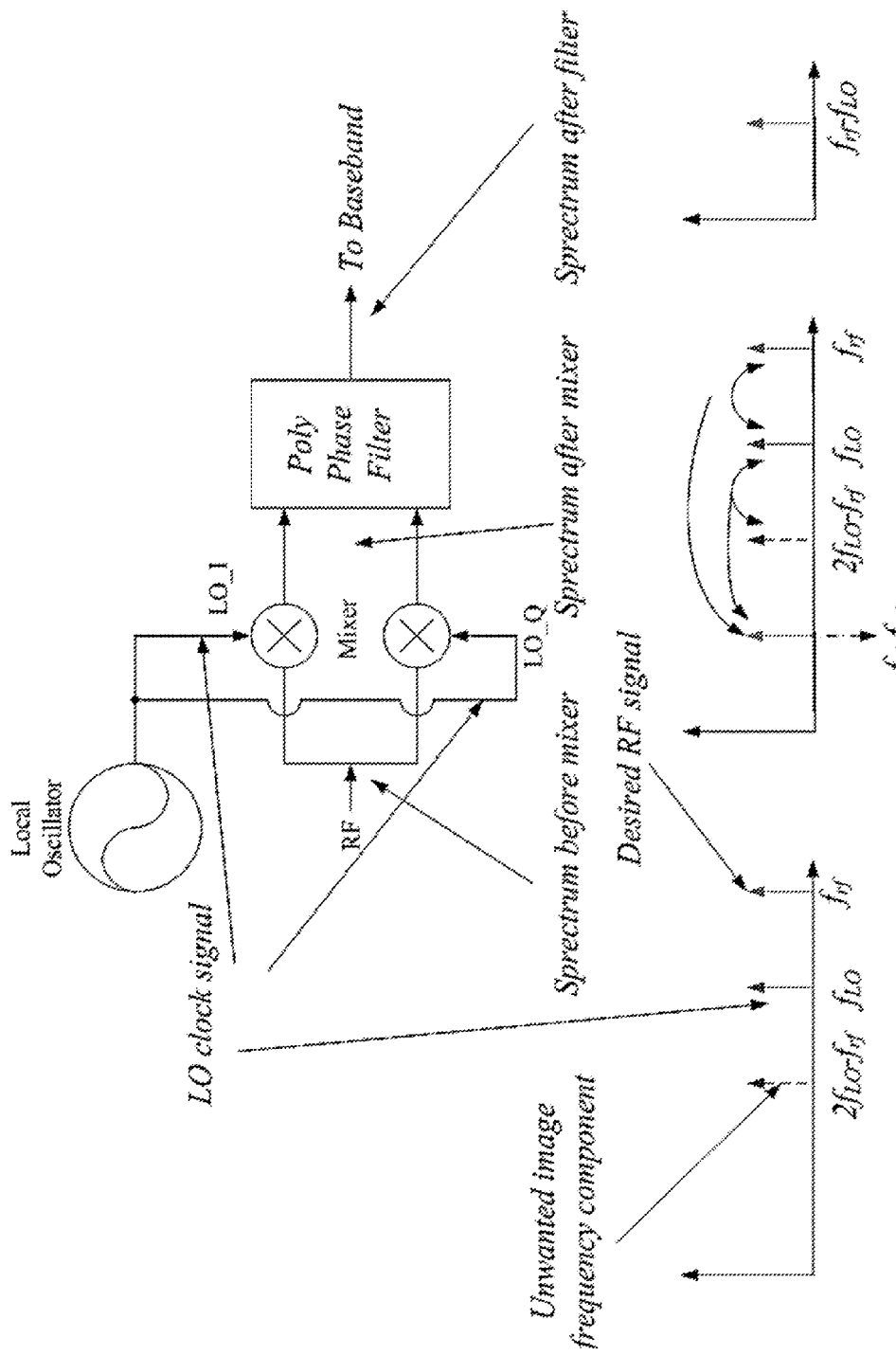
FIG. 3 illustrates various diagrams of a low IF system using a quadrature clock and poly phase filter to perform image rejection.
Figure 4A:
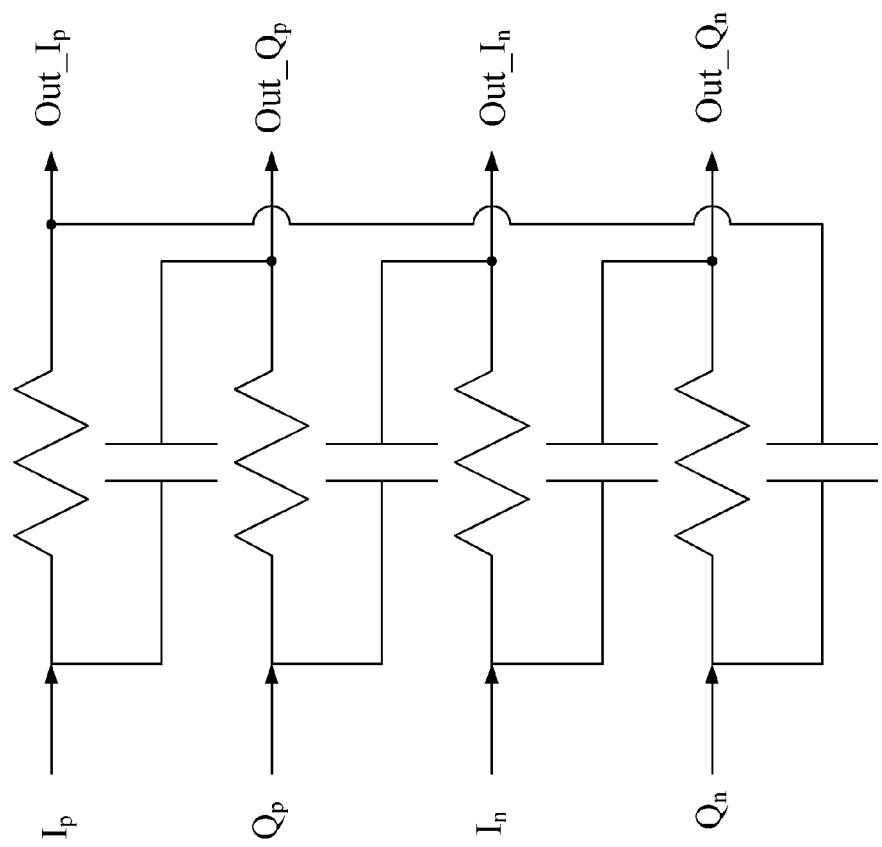
FIG. 4A is a circuit diagram of a 1-stage poly phase filter.
Figure 4B:
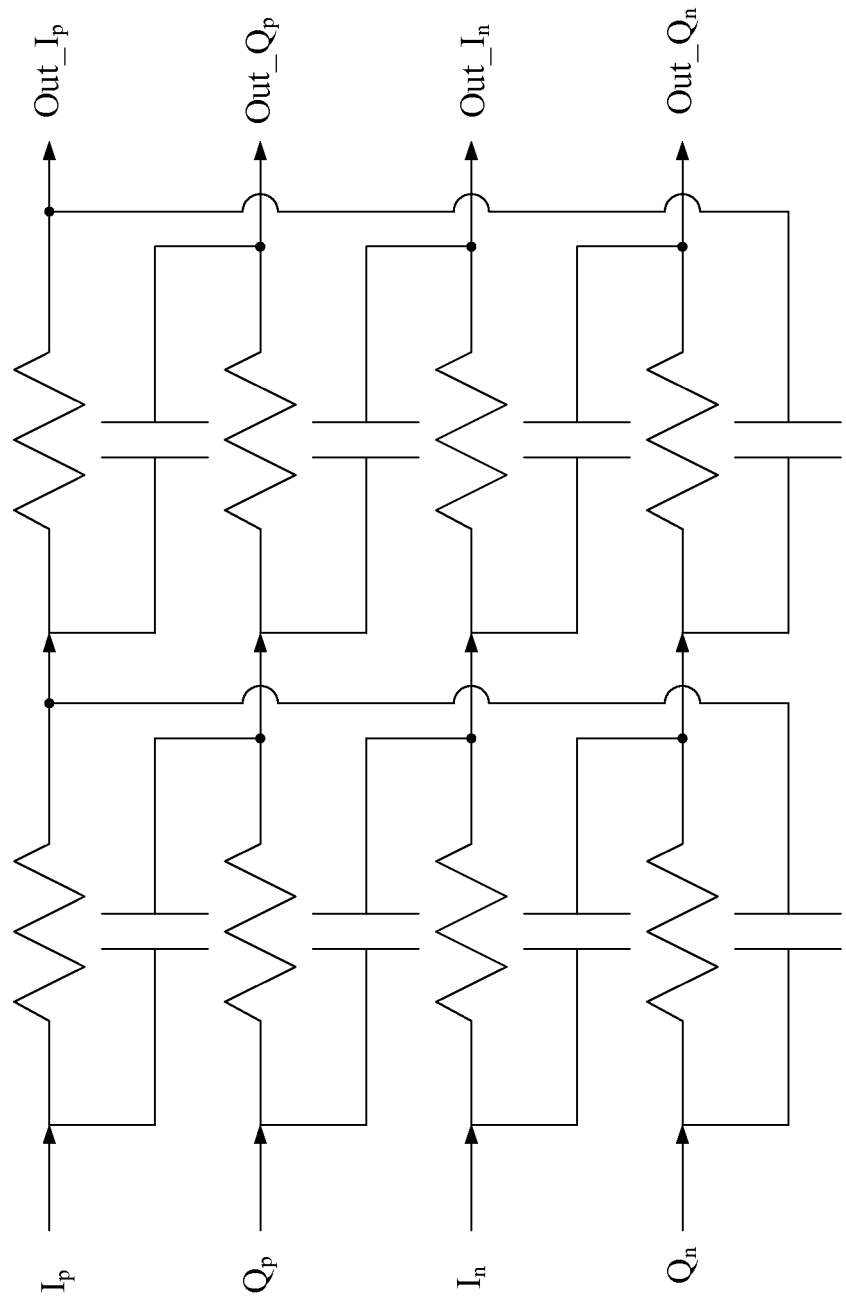
FIG. 4B is a circuit diagram of a 2-stage poly phase filter.
Figure 5:
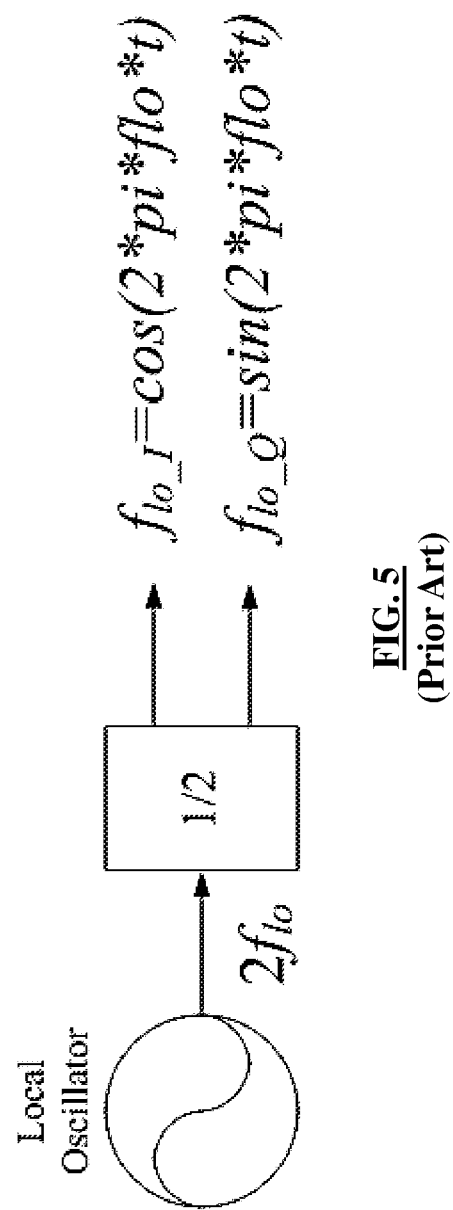
FIG. 5 is a diagram illustrating a local oscillator that oscillates at 2flo and divided down to obtain the I and Q clock phase.
Figure 6A:
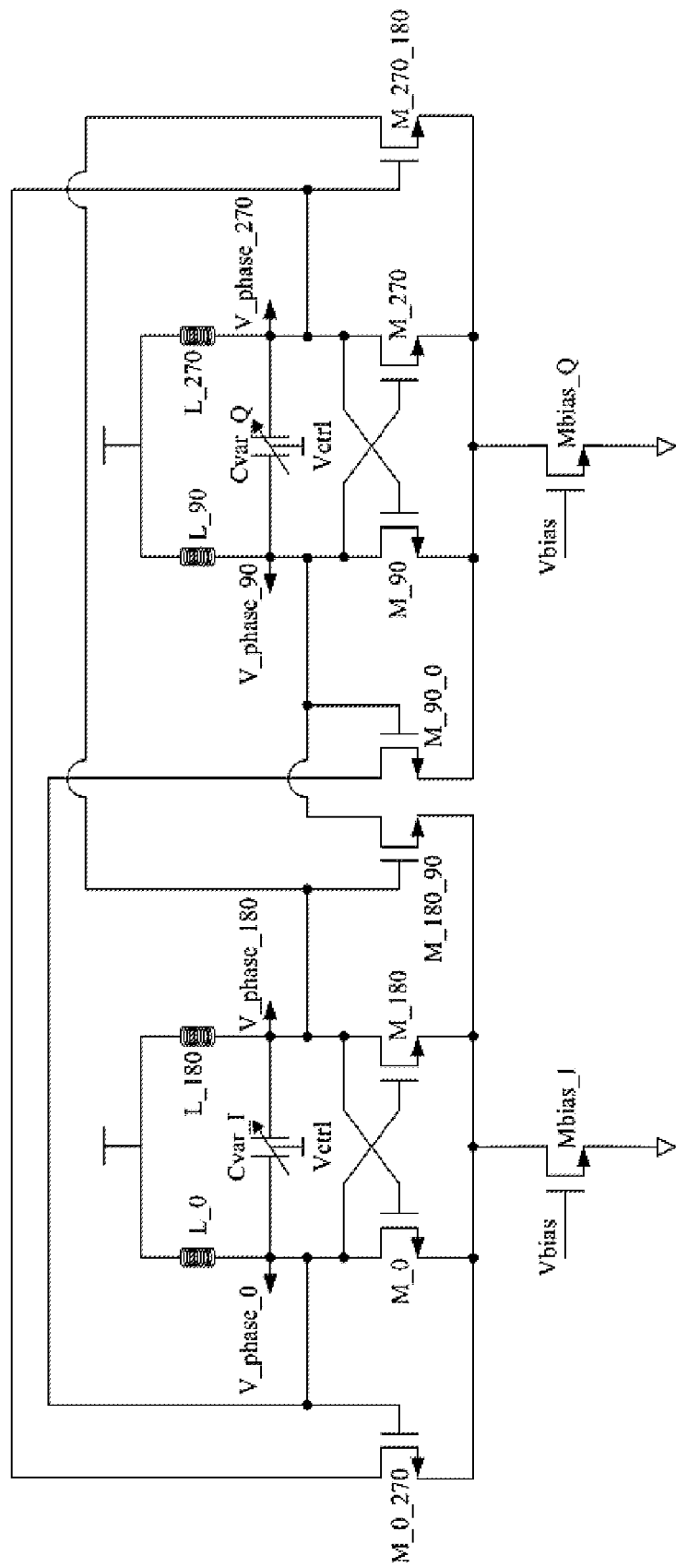
FIG. 6A is circuit diagram illustrating two identical LC tank VCOs coupled with active devices to generate I/Q clock signals.
Figure 6B:
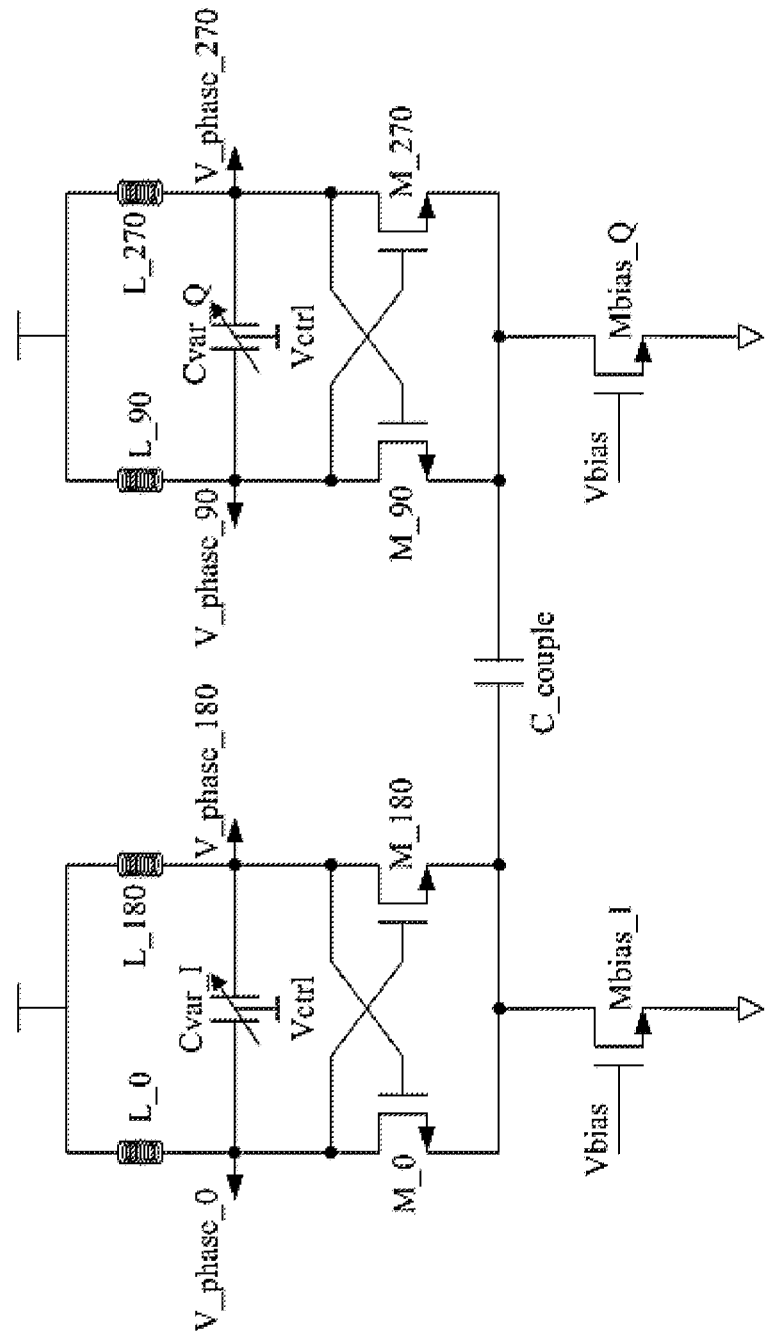
FIG. 6B is a circuit diagram illustrating two identical LC tank VCOs coupled with a capacitor.

An LC oscillator has good phase noise but active coupling of two LC oscillators generates non-accurate I/Q phase clock signals. However, removing active coupling will result in ambiguous phase rotation direction. On the other hand, a ring oscillator has a very well-defined phase rotation order. Thus one would be tempted to simply apply a LC tank load to each delay stage's output of the ring oscillator to achieve the benefit of both oscillators, namely good phase noise and determined phase rotation direction of multiple even spaced phase outputs. However, this approach will not work. For example, one may be tempted to simply put the LC tank load to the ring oscillator's output. However, this method will only stabilize the frequency without any phase noise improvement. Why the phase noise of such a LC tank ring oscillator is poor can be explained by FIG. 2E. As mentioned above, the LC tank oscillator has its phase noise advantage due to it tank impedance profiling, where, at resonance frequency of the parallel LC tank, the inductive impedance cancels the capacitive impedance, and the tank exhibits high impedance and behaves like a resistor. The delay stage exhibits no phase shift from input to output at resonance. At frequencies lower than the resonance, the tank exhibits inductance impedance and delay stage provides a phase lead from input to output. At frequencies higher than the resonance, the tank exhibits capacitive impedance and the delay stage provides a phase lag from input to output. As the ring oscillator requires a phase shift of 360/N degrees between any adjacent delay stages, simply putting the LC tank load to the output of the ring oscillator will force the tank to operate either as inductive element or capacitive element. Both scenarios mandate that a phase shift from the input to the output of the delay stage and that the phase shift shifts the tank operating frequency away from its peak resonance frequency where its phase noise is best.

The embodiments herein provide a solution to this dilemma where a ring oscillator mandates a phase shift of each delay stage while a LC tank has its best phase noise at resonance, which means no delay if one uses normal transconductance. In normal transconductance, the delay of each stage is mainly contributed by the output load while the input transconductance simply translates the input signal into current and delivers to the output. Thus, when the LC tank is given two contradictory objectives, namely phase shift and high gain at resonance, the problem becomes unsolved.

The embodiments herein add one degenerative capacitor Cdeg 106 to the source 103 of the input transconductance. By doing this, the input device Mbias 105 is no longer simply transferring the voltage into current, but rather it can also introduce delay as well. Then, the output LC_tank 115, 117 load is decoupled from its contradictory requirements. In this case, the phase shift of the delay stage is provided by the degenerated input stage and the output LC_tank 115, 117 still operates at its resonance to provide the best phase noise. Adding the capacitor Cdeg 106 to degenerate the input transconductance introduces a zero into the system and the input/output transfer function of each delay stage in FIGS. 7A through 7D is as follows:

$$\frac{V_{OUT}}{V_{IN}} = \frac{-G_{ds\_tail}}{G_T} \frac{1 + \frac{s}{z_1}}{1 + \frac{s}{p_1}},$$

$$z_1 \approx \frac{G_{ds\_tail}}{C_{deg}},$$

$$p_1 \approx k\frac{G_{m\_in}}{(C_{gs\_in} + C_{deg})},$$

$$k = \frac{G_T}{G_T + G_{ds\_in}}$$

here $G_{ds\_tail}$ refers to the channel admittance of the bias device Mbias 105, $G_T$ refers to the LC_tank 115, 117 admittance, $C_{deg}$ refers to the degenerative capacitance, $G_{m\_in}$ refers to the transconductance of the input device Min 100, $G_{ds\_in}$ refers to the channel admittance of the input device Min 100. It is evident that the zero which is $$\frac{G_{ds\_tail}}{C_{deg}}$$

provides a 90 degrees phase lead when the frequency is well below $$k\frac{G_{m\_in}}{(C_{gs\_in} + C_{deg})}.$$

If one chooses the device transconductance so that the pole frequency is well above the tank resonance frequency and the zero frequency is well below the resonance frequency, then at resonance, there could be a 90 degrees phase lead from input to output. Thus, by separating the input device from its traditional role of voltage to current converter and transforming it into a device that can introduce phase lead, one can retain the benefit of the ring oscillator's well-defined output phase orders and at the same time, enjoy the superior phase noise of the LC tank oscillator. In experimental testing, the VCO architecture 50, 51, 55, 56 exhibits less than 0.1 degrees of phase error when one hundred Monte-Carlo simulations are run, and better than 93 dBc phase noise at 100 KHz offset from center frequency.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A multi-phase voltage controlled oscillator (VCO) comprising:
    a chain of at least four ring oscillator delay stage cells, wherein each stage comprises a Gm/C delay element and a LC tank load that creates no ambiguity of phase rotation direction, wherein an output voltage of each stage in said chain is input as an input voltage of a subsequent stage in said chain, wherein the output voltage of a last stage in said chain is fed back as an input voltage of a first stage in said chain, wherein each delay stage in said chain exhibits no phase shift from input to output at resonance, and wherein each stage in said chain comprises:
        a pair of transistors comprising a first transistor connected to a second transistor without an intervening switch therebetween;
        said first transistor comprising a first source, a first drain, a first bulk terminal, and a first gate, said first transistor receiving an input voltage through said first gate;
        an output voltage terminal that outputs voltage from said first transistor and is connected to said first drain;
        said second transistor comprising a second source, a second drain, a second bulk terminal, and a second gate, said second transistor receiving a bias voltage through said second gate, wherein said first source is connected to said second drain without an intervening switch therebetween;
        a first capacitor connected to said first source, said second source, and said second drain;
        an inductor connected to said first drain; and
        a second capacitor connected in parallel with said inductor to form said LC tank load, wherein said LC tank load is directly connected to said first drain without direct connection to said first gate and without direct connection to any other transistor other than said first transistor, wherein said first bulk terminal is connected to said first source and said second bulk terminal is connected to ground, and wherein said first transistor and said second transistor are connected to each other in a non-cross-coupled configuration.

2. The multi-phase VCO of claim 1, wherein the first and second transistors comprise any of a n-type metal-oxide-semiconductor (NMOS) transistor and a p-type metal-oxide-semiconductor (PMOS) transistor.

3. The multi-phase VCO of claim 1, further comprising a power supply voltage terminal connected to any of said inductor and said second source.

4. The multi-phase VCO of claim 1, wherein a top plate of said first capacitor is connected to said first source and said second drain, and wherein a bottom plate of said first capacitor is connected to ground.

5. The multi-phase VCO of claim 1, wherein said second transistor transfers said input voltage into current and creates a phase shift delay in the output voltage.

6. The multi-phase VCO of claim 1, wherein said chain of at least four ring oscillator delay stage cells generates 0, 90, 180, and 270 degree phases when said chain comprises four ring oscillator delay stage cells.

7. The multi-phase VCO of claim 1, wherein chain of at least four ring oscillator delay stage cells generates 0, 45, 90, 135, 180, 225, 270, and 315 degree phases when said chain comprises eight ring oscillator delay stage cells.

8. The multi-phase VCO of claim 1, wherein said first capacitor degenerates an input transconductance of said first transistor.

9. The multi-phase VCO of claim 1, wherein an input/output transfer function of each said unit delay stage comprises:

$$\frac{V_{OUT}}{V_{IN}} = \frac{-G_{ds\_tail}}{G_T} \frac{1+\frac{s}{z_1}}{1+\frac{s}{p_1}},$$

$$z_1 \approx \frac{G_{ds\_tail}}{C_{deg}},$$

$$p_1 \approx k\frac{G_{m\_in}}{(C_{gs\_in}+C_{deg})},$$

$$k = \frac{G_T}{G_T+G_{ds\_in}},$$

wherein $G_{ds\_tail}$ comprises a channel admittance of said second transistor, wherein $G_T$ comprises an admittance of said inductor in parallel with said second capacitor, wherein $C_{deg}$ comprises a degenerative capacitance, wherein $G_{m\_in}$ comprises a transconductance of said first transistor, and wherein $G_{ds\_in}$ comprises a channel admittance of said first transistor.

10. The multi-phase VCO of claim 9, wherein said first capacitor degenerates said transconductance of said first transistor and introduces a zero into said input/output transfer function, wherein said zero comprises $$\frac{G_{ds\_tail}}{C_{deg}}$$

and provides a 90 degrees phase lead when frequency is below $$k\frac{G_{m\_in}}{(C_{gs\_in}+C_{deg})}.$$

11. A multi-phase voltage controlled oscillator (VCO) comprising:

a chain of a plurality of ring oscillator delay stage cells, wherein each stage comprises a Gm/C delay element and a LC tank load that creates no ambiguity of phase rotation direction, wherein an output voltage of each stage in said chain is input as an input voltage of a subsequent stage in said chain, wherein the output voltage of a last stage in said chain is fed back as an input voltage of a first stage in said chain, wherein each delay stage in said chain exhibits no phase shift from input to output at resonance, and wherein each stage in said chain comprises:

a pair of transistors comprising an input transistor connected to a bias transistor without an intervening switch therebetween;

said input transistor comprising a first source terminal, a first drain terminal, a first bulk terminal, and a first gate terminal, said input transistor adapted to receive an input voltage through said first gate terminal;

an output voltage terminal adapted to output voltage from said input transistor, said output voltage terminal being connected to said first drain terminal;

said bias transistor comprising a second source terminal, a second drain terminal, a second bulk terminal, and a second gate terminal, wherein said bias transistor is adapted to receive a bias voltage through said second gate terminal, and wherein said first source terminal is connected to said second drain terminal without an intervening switch therebetween;

a degenerative capacitor connected to said first source terminal, said second source terminal, and said second drain terminal, wherein said degenerative capacitor degenerates an input transconductance of said input transistor; and said LC tank load directly connected to said first drain terminal without direct connection to said first gate terminal and without direct connection to any other transistor other than said input transistor, wherein said LC tank load comprises:

a tank inductor connected to said first drain terminal; and a tank capacitor connected in parallel with said tank inductor and further connected to said first drain terminal, wherein said first bulk terminal is connected to said first source and said second bulk terminal is connected to ground, and wherein said input transistor and said bias transistor are connected to each other in a non-cross-coupled configuration.

12. The multi-phase VCO of claim 11, wherein the input and bias transistors comprise any of a n-type metal-oxidesemiconductor (NMOS) transistor and a p-type metal-oxide-semiconductor (PMOS) transistor.

13. The multi-phase VCO of claim 11, further comprising a power supply voltage terminal that receives a power supply voltage and is connected to any of said tank inductor and said second source terminal.

14. The multi-phase VCO of claim 11, wherein a top plate of said degenerative capacitor is connected to said first source terminal and said second drain terminal, and wherein a bottom plate of said degenerative capacitor is connected to ground.

15. The multi-phase VCO of claim 11, wherein said bias transistor transfers said input voltage into current and creates a phase shift delay in the output voltage.

16. The multi-phase VCO of claim 11, wherein said chain of at least four ring oscillator delay stage cells generates 0, 90, 180, and 270 degree phases when said chain comprises four ring oscillator delay stage cells.

17. The multi-phase VCO of claim 11, wherein said chain of at least four ring oscillator delay stage cells generates 0, 45, 90, 135, 180, 225, 270, and 315 degree phases when said chain comprises eight ring oscillator delay stage cells.

18. The multi-phase VCO of claim 11, wherein an input/output transfer function of each said unit delay stage comprises:

$$\frac{V_{OUT}}{V_{IN}} = \frac{-G_{ds\_tail}}{G_T} \frac{1+\frac{s}{z_1}}{1+\frac{s}{p_1}},$$

$$z_1 \approx \frac{G_{ds\_tail}}{C_{deg}},$$

$$p_1 \approx k \frac{G_{m\_in}}{(C_{gs\_in} + C_{deg})},$$

$$k = \frac{G_T}{G_T + G_{ds\_in}},$$

wherein $G_{ds\_tail}$ comprises a channel admittance of said bias transistor, wherein $G_T$ comprises an admittance of said tank inductor in parallel with said tank capacitor, wherein $C_{deg}$ comprises a degenerative capacitance, wherein $G_{m\_in}$ comprises a transconductance of said input transistor, and wherein $G_{ds\_in}$ comprises a channel admittance of said input transistor.

19. The multi-phase VCO of claim 18, wherein said degenerative capacitor degenerates said transconductance of said input transistor and introduces a zero into said input/output transfer function, wherein said zero comprises $$\frac{G_{ds\_tail}}{C_{deg}}$$

and provides a 90 degrees phase lead when frequency is below $$k \frac{G_{m\_in}}{(C_{gs\_in} + C_{deg})}.$$

* * * * *